United States Patent
Ikegami et al.

(10) Patent No.: US 10,444,273 B2
(45) Date of Patent: Oct. 15, 2019

(54) PARTIAL DISCHARGE MEASUREMENT DEVICE

(71) Applicants: TOSHIBA MITSUBISHI-ELECTRIC INDUSTRIAL SYSTEMS CORPORATION, Chuo-ku (JP); Kabushiki Kaisha Toshiba, Minato-ku (JP); TOSHIBA INDUSTRIAL PRODUCTS AND SYSTEMS CORPORATION, Kawasaki-shi (JP)

(72) Inventors: Tomomi Ikegami, Tokyo (JP); Tetsuo Yoshimitsu, Tokyo (JP); Takayuki Sakurai, Tokyo (JP); Tatsuya Hirose, Inagi (JP); Satoshi Hiroshima, Kawasaki (JP); Yuji Yamamoto, Mie (JP)

(73) Assignees: TOSHIBA MITSUBISHI-ELECTRIC INDUSTRIAL SYSTEMS CORPORATION, Chuo-ku (JP); KABUSHIKI KAISHA TOSHIBA, Minato-ku (JP); TOSHIBA INDUSTRIAL PRODUCTS AND SYSTEMS CORPORATION, Kawasaki-shi (JP)

( * ) Notice: Subject to any disclaimer, the term of this patent is extended or adjusted under 35 U.S.C. 154(b) by 380 days.

(21) Appl. No.: 15/303,936

(22) PCT Filed: Apr. 21, 2015

(86) PCT No.: PCT/JP2015/002174
§ 371 (c)(1),
(2) Date: Oct. 13, 2016

(87) PCT Pub. No.: WO2015/162914
PCT Pub. Date: Oct. 29, 2015

(65) Prior Publication Data
US 2017/0038424 A1 Feb. 9, 2017

(30) Foreign Application Priority Data

Apr. 23, 2014 (JP) ................................ 2014-089578

(51) Int. Cl.
*G01R 31/12* (2006.01)
*G01R 31/02* (2006.01)
(Continued)

(52) U.S. Cl.
CPC ....... *G01R 31/1272* (2013.01); *G01R 31/024* (2013.01); *G01R 31/34* (2013.01); *G01R 31/346* (2013.01); *H01H 9/50* (2013.01)

(58) Field of Classification Search
CPC .. G01R 31/1272; G01R 31/346; G01R 31/34; G01R 31/024; H01H 9/50
See application file for complete search history.

(56) References Cited

U.S. PATENT DOCUMENTS 9,322,881 B2 * 4/2016 Sakurai ................ G01R 31/343
2015/0015303 A1 1/2015 Sakurai et al.

FOREIGN PATENT DOCUMENTS

EP 2 827 159 A1 1/2015
JP 3-293569 A 12/1991
(Continued)

OTHER PUBLICATIONS

International Search Report dated Jul. 28, 2015 in PCT/JP2015/002174 filed Apr. 21, 2015.
(Continued)

*Primary Examiner* — Amy He
(74) *Attorney, Agent, or Firm* — Oblon, McClelland, Maier & Neustadt, L.L.P.

(57) ABSTRACT

A partial discharge measurement device includes: an impulse voltage application unit; a measurement control unit; and first and second partial discharge detection unit.
(Continued)

The measurement control unit includes: a first and a second detector level partial discharge counting unit; and a partial discharge resistance evaluation unit. Each of the first and the second detector level partial discharge counting units outputs a first or second detection signal when the first or second detection signal exceeds a predetermined specified value. The partial discharge resistance evaluation unit counts the number of occurrences of partial discharge based on an output from the first and second detector level partial discharge counting unit, and regards the impulse voltage value at which the count value has reached a predetermined value as a partial discharge inception voltage under the repeated impulse voltage application.

7 Claims, 7 Drawing Sheets

(51) Int. Cl.
*H01H 9/50* (2006.01)
*G01R 31/34* (2006.01)

(56) References Cited

FOREIGN PATENT DOCUMENTS

| | | |
|---|---|---|
| JP | 9-257867 A | 10/1997 |
| JP | 2000-346916 A | 12/2000 |
| JP | 2005-147890 A | 6/2005 |
| JP | 2008-180681 A | 8/2008 |
| JP | 2013-2871 A | 1/2013 |
| WO | 2013/136793 A1 | 9/2013 |

OTHER PUBLICATIONS

Office Action dated Dec. 5, 2017 in corresponding Japanese Patent Application No. 2014-089578 (with English Translation), 8 pages.
Extended European Search Report dated Nov. 8, 2017 in corresponding European Patent Application No. 15782828.6, 9 pages.

* cited by examiner

PARTIAL DISCHARGE MEASUREMENT DEVICE

TECHNICAL FIELD

The present invention relates to a partial discharge measurement device for measuring a partial discharge inception voltage or a partial discharge extinction voltage under the repeated impulse voltage application.

BACKGROUND ART

It is widely known that when an electric motor is driven by an inverter, a surge voltage is generated by high-speed switching in the inverter to affect insulation of a motor winding. Such a surge voltage is called "inverter surge" and may sometimes reach double or more of the rated voltage. When the inverter surge is applied to the motor windings, a partial discharge may occur inside or outside the windings. Such a partial discharge may cause a degradation of a coating of an enamel wire constituting the winding. The degradation of the coating may lead to an insulation breakdown. Thus, there is desired an insulation design of the electric motor that prevents the partial discharge from occurring even when the inverter surge is applied to the windings.

Conventionally, insulation performance of the motor windings is evaluated based on partial discharge characteristics obtained by application of a sinusoidal alternate voltage, especially, a partial discharge inception voltage. However, a potential distribution in the winding differs between when the sinusoidal alternate voltage is applied and when the surge voltage is applied. Therefore, the insulation performance of the inverter-driven electric motor is evaluated desirably by application of an impulse voltage simulating the surge voltage. Further, in partial discharge measurement conducted by application of the impulse voltage, voltage changes steeply at rising time (at application start time) of the impulse voltage, so that there is required a different approach from the partial discharge measurement conducted by application of the sinusoidal alternate voltage.

A guideline of a partial discharge measurement method that applies a repeated impulse voltage is internationally regulated. The guideline defines that an impulse voltage applied when the number of impulses at which a partial discharge is generated with respect to the number of all the applied impulse voltages reaches a specified frequency or more is regarded as a partial discharge inception voltage, which is called a partial discharge inception voltage under the repeated impulse voltage application. Further, a voltage is dropped after generation of the partial discharge by impulses equal to or more than a specified frequency, and the number of impulses at which the partial discharge is generated becomes less than the specified frequency. An impulse voltage at this time is regarded as a partial discharge extinction voltage, which is called a partial discharge extinction voltage under the repeated impulse voltage application. By measuring the partial discharge inception voltage under the repeated impulse voltage application or partial discharge extinction voltage under the repeated impulse voltage application, insulation performance of an inverter-driven electric motor is evaluated.

The partial discharge inception voltage under the repeated impulse voltage application is measured, for example, as follows. A measurement control program disposed on an oscilloscope instructs an impulse power source to output a predetermined voltage and takes in an applied voltage signal measured by a high-voltage probe and an output signal of a current transformer (CT) as a partial discharge sensor. The measurement control program instructs the impulse power source to output a voltage V1 10 times and then takes in applied voltages and signal data output from the CT for 10 times. When detecting an impulse at which the CT output signal exceeds a discharge determination specified value, the program determines that a partial discharge has been generated by that impulse.

In a case where the number of partial discharge generating impulses does not reach a predetermined number when the applied voltage is V1, the measurement control program instructs the impulse power source to output a higher voltage. Every time the measurement control program instructs the impulse power source to output a voltage V2, voltage V3, and voltage V4, it calculates the number of impulses at which the partial discharge is generated. For example, when the number of partial discharge generating impulses reaches a predetermined number, e.g., five at a voltage of V4, the voltage value V4 is regarded as the partial discharge inception voltage under the repeated impulse voltage application.

The voltage gradually drops from the voltage of V4, and the number of partial discharge generating impulses becomes less than a predetermined number. A voltage at this time is regarded as the partial discharge extinction voltage.

PRIOR ART DOCUMENT

Patent Document

[Patent Document 1] Japanese Patent Application Laid-Open Publication No. 2013-2871

SUMMARY OF THE INVENTION

Problems to be Solved by the Invention

When the partial discharge inception voltage or the like is measured in an electric motor, an impulse voltage is applied between enamel wire windings or between a winding and an iron core. When an impulse voltage containing a high-frequency component is applied to the winding of the electric motor, the impulse generates vibration or reflection by an action of an inductance of the winding, a capacitance between the winding and iron core, or a capacitance between the windings, causing a high voltage to be applied to any portion inside the electric motor; however, the portion where the high voltage is applied cannot be specified easily. The portion where the high voltage is applied may be a portion inside a slot of the iron core, a portion inside the winding formed by winding a wire many times, or coil ends at both sides in an iron core axis direction, so that the partial discharge may fail to be detected depending on the location of a partial discharge sensor for detecting an electromagnetic wave having directivity.

Assume here that an antenna is applied to the electric motor. In this case, when the partial discharge is generated on an opposite side to the position of the antenna, the partial discharge sensor cannot detect the generated partial discharge. Or, a sensor output signal is so small that the partial discharge sensor cannot recognize the signal as the partial discharge, with the result that the voltage continues to rise.

Further, when the partial discharge is generated at a location slightly separated from the sensor position, a partial discharge signal to be detected becomes so small that the partial discharge sensor cannot recognize the signal as the partial discharge until the voltage is increased to a higher level, with the result that the measured partial discharge inception voltage under the repeated impulse voltage application is measured higher than the actual voltage.

Further, a partial discharge signal obtained upon detection of the partial discharge is weak. Therefore, a level of the partial discharge signal often becomes almost the same as ambient noise level. Thus, when the partial discharge is measured in a noisy environment, it is difficult to distinguish the partial discharge signal from the noise, which may result in erroneous measurement of the partial discharge inception voltage during application of a repeated impulse voltage.

The present invention has been made to solve the problems described above, and an object thereof is to accurately obtain the partial discharge inception voltage or partial discharge extinction voltage in a measurement method based on the repeated impulse voltage which is performed for evaluating insulation performance of an object to be measured such as electric motor windings.

Means for Solving the Problem

According to the present invention, there is provided a partial discharge measurement device for measuring partial discharge characteristics observed when a repeated impulse voltage is applied to an object to be measured, the device comprising: an impulse voltage application unit to generate the repeated impulse voltage at time intervals and to apply the generated repeated impulse voltage to the object to be measured; a measurement control unit to instruct a level and an occurrence time of the repeated specified number of times of impulse voltage having a same peak value, to the impulse voltage application unit, and to instruct the impulse voltage application unit to change the voltage as needed after the repeated impulse voltage applications at the specified number of times; and first and second partial discharge detection units to detect a partial discharge generated in the object to be measured as a result of the repeated impulse voltage application, wherein the measurement control unit includes: a first detector level partial discharge counting unit to determine whether or not a first detection signal from the first partial discharge detection unit exceeds a predetermined specified value, and to output the first detection signal that exceeds the predetermined specified value in response to a predetermined number of the repeated impulse voltage applications as partial discharge occurrence of the partial discharge detector level together with the occurrence time; a second detector level partial discharge counting unit to determine whether or not a second detection signal from the second partial discharge detection unit exceeds a predetermined specified value, and to output the second detection signal that exceeds the predetermined specified value in response to a predetermined number of the repeated impulse voltage applications as partial discharge occurrence of the partial discharge detector level together with the occurrence time; and a partial discharge resistance evaluation unit to count, when a voltage level is changed to an increase side, the number of occurrences of partial discharge based on an output from the first detector level partial discharge counting unit and an output from the second detector level partial discharge counting unit, and to determine whether or not the number of occurrences has reached a predetermined value in response to the specified number of repeated impulse voltage applications, and to regard an impulse voltage value at which the count value has reached the predetermined value as a partial discharge inception voltage under the repeated impulse voltage application.

Advantage of the Invention

According to the present invention, the partial discharge inception voltage or partial discharge extinction voltage can be accurately obtained in a measurement method based on the repeated impulse voltage which is performed for evaluating insulation performance of an object to be measured such as electric motor windings.

DETAILED DESCRIPTION

Figure 1:
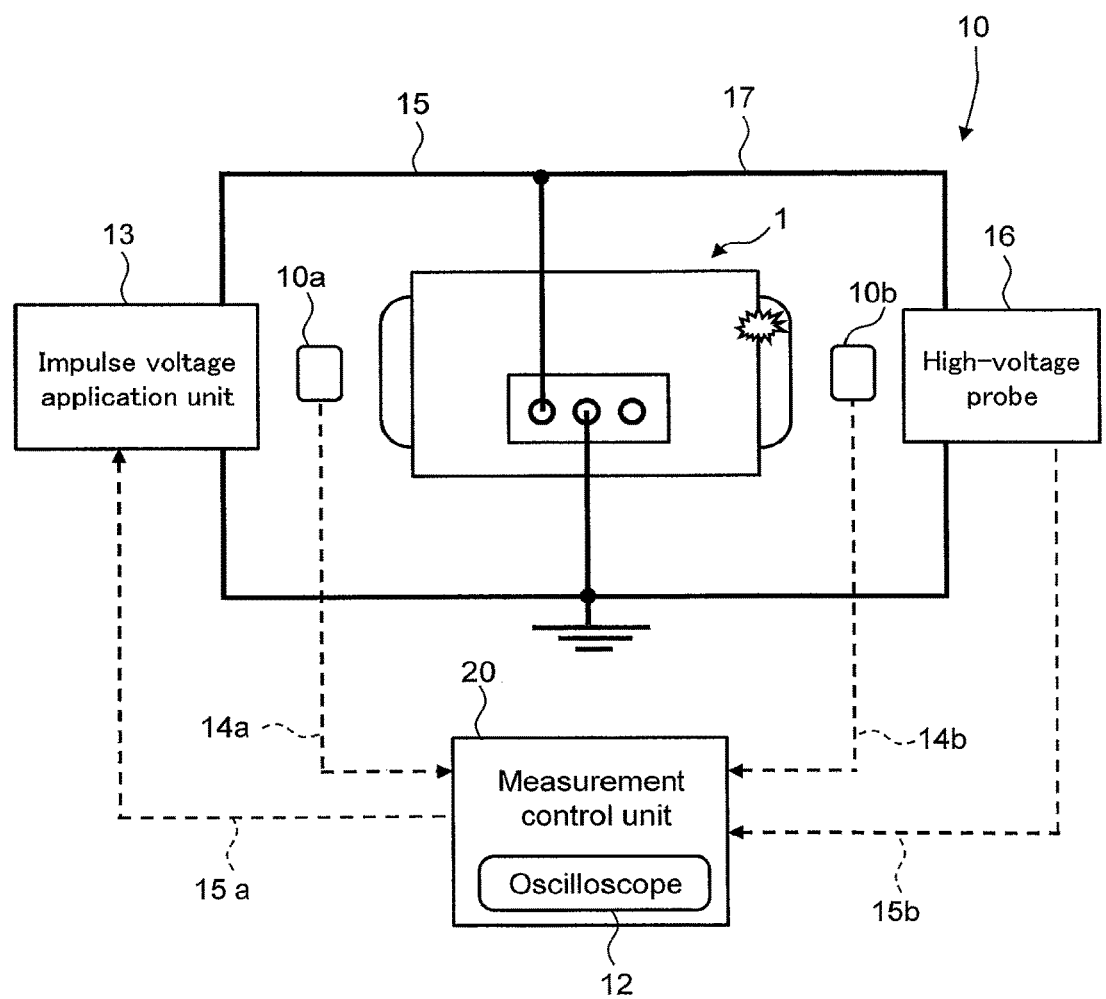
FIG. 1 is a conceptual block diagram illustrating a configuration of a partial discharge measurement device according to a first embodiment.

Hereinafter, a partial discharge measurement device according to embodiments of the present invention will be described with reference to the drawings. Throughout the description, the same reference numerals are given to the same or similar parts, and repeated description will be omitted.

First Embodiment

FIG. 1 is a conceptual block diagram illustrating a configuration of a partial discharge measurement device according to a first embodiment. An electric motor 1 is taken as an example of a device to be measured. A partial discharge measurement device 10 includes: an impulse voltage application unit 13 that applies a voltage to the electric motor 1 through a cable 15; a high-voltage probe 16 that measures the applied voltage through a cable 17; a first partial discharge detection unit 10a and a second partial discharge detection unit 10b both of which detect a partial discharge generated in the electric motor 1; and a measurement control unit 20. The first partial discharge detection unit 10a and the measurement control unit 20 are connected by a cable 14a, and the second partial discharge detection unit 10b and the measurement control unit 20 are connected by a cable 14b. The impulse voltage application unit 13 and the measurement control unit 20 are connected by a cable 15a, and the high-voltage probe 16 and the measurement control unit 20 are connected by a cable 15b.

The impulse voltage application unit 13 applies a predetermined impulse voltage to the electric motor 1 based on an instruction from the measurement control unit 20. The high-voltage probe 16 measures the voltage applied to the electric motor 1 and outputs a measurement signal to the measurement control unit 20. The measurement control unit 20 has an oscilloscope 12 for observing a signal waveform, and the signal from the high-voltage probe 16 is displayed on the oscilloscope 12. Signals from the first and second partial discharge detection units 10a and 10b that detect the partial discharge are also displayed on the oscilloscope 12.

The measurement control unit 20 outputs an instruction signal to the impulse voltage application unit 13, then takes in an applied voltage signal from the high-voltage probe 16, and outputs signals from the first and second partial discharge detection units 10a and 10b to measure the partial discharge inception voltage or partial discharge extinction voltage under the repeated impulse voltage application.

The output signals from the first and second partial discharge detection units 10a and 10b contain background noise. Thus, a predetermined specified value is set to a level higher than the background noise to prevent erroneous detection of the partial discharge due to the noise.

The first and second partial discharge detection units 10a and 10b may each be of a type that measures an electromagnetic wave, such as a loop antenna or a patch antenna. Alternatively, the first and second partial discharge detection units 10a and 10b may each be of a type that detects a current generated in a circuit of the electric motor 1 by the partial discharge, such as a high-frequency CT. Further alternatively, the first and second partial discharge detection units 10a and 10b may each be of a type that uses an acoustic sensor system that detects an ultrasonic wave generated by the partial discharge. Which type is to be used may be determined considering environmental conditions and the like at a test time. The first partial discharge detection unit 10a and the second partial discharge detection unit 10b are disposed in such a way as to be separated from each other so that discharge characteristics of different portions of the electric motor 1 can be measured.

The measurement control unit 20 outputs a voltage application instruction signal including a level of the voltage to be applied, to the impulse voltage application unit 13. The measurement control unit 20 receives signals respectively from the high-voltage probe 16 and the first and second partial discharge detection units 10a and 10b.

Figure 2:
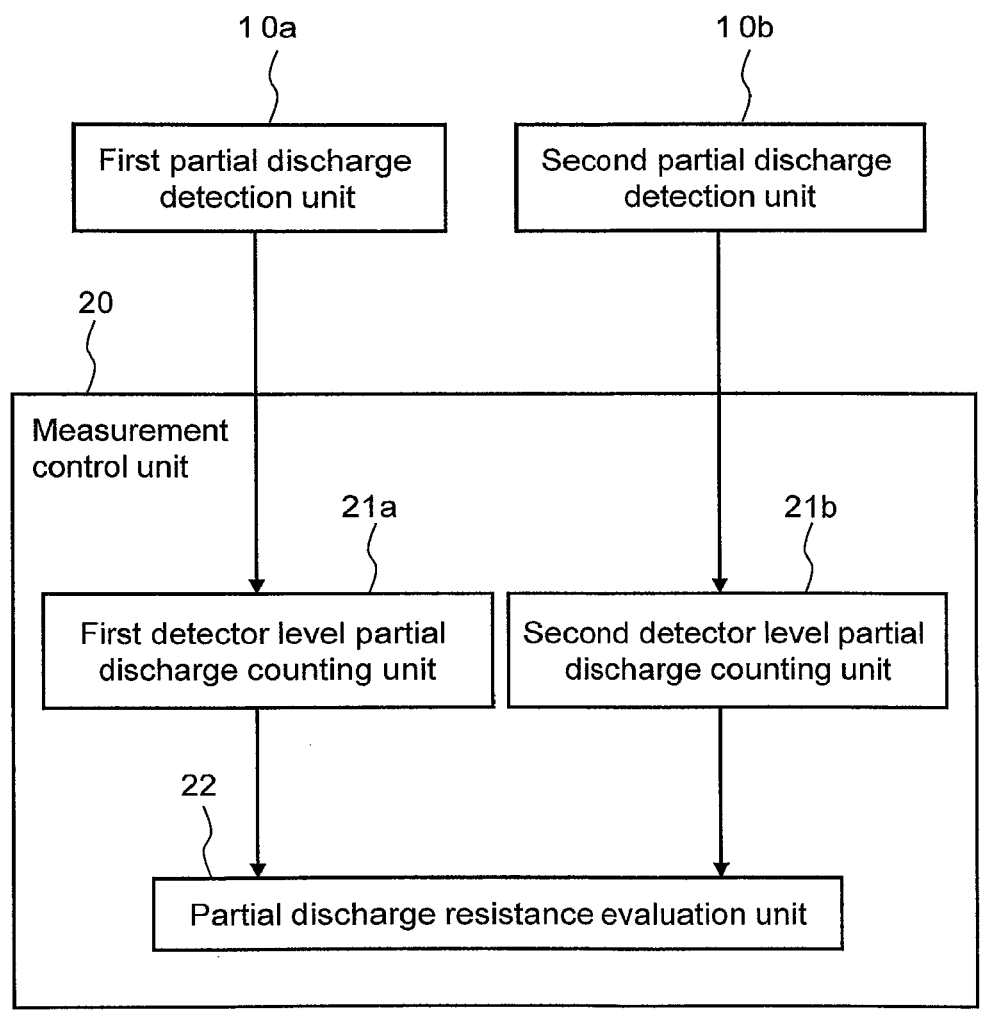
FIG. 2 is a block diagram illustrating a configuration of a measurement control unit of the partial discharge measurement device according to the first embodiment.

FIG. 2 is a block diagram illustrating a configuration of the measurement control unit of the partial discharge measurement device according to the first embodiment. The measurement control unit 20 includes a first detector level partial discharge counting unit 21a, a second detector level partial discharge counting unit 21b, and a partial discharge resistance evaluation unit 22.

The first detector level partial discharge counting unit 21a receives an output from the first partial discharge detection unit 10a. The first detector level partial discharge counting unit 21a determines whether or not the level of the detection signal from the first partial discharge detection unit 10a exceeds a predetermined specified value. The first detector level partial discharge counting unit 21a outputs the detection signal to the partial discharge resistance evaluation unit 22 every time the detection signal exceeds the predetermined specified value in response to a predetermined number of impulse voltage applications.

The second detector level partial discharge counting unit 21b receives an output from the second partial discharge detection unit 10b. The second detector level partial discharge counting unit 21b determines whether or not a level of the detection signal, from the second partial discharge detection unit 10b, exceeds a predetermined specified value and outputs the detection signal to the partial discharge resistance evaluation unit 22 every time the detection signal exceeds the predetermined specified value in response to a predetermined number of impulse voltage applications.

The partial discharge resistance evaluation unit 22 counts, every time it receives an output from the first detector level partial discharge counting unit 21a, the number of input signals from the first detector level partial discharge counting unit 21a at an applied voltage. Further, the partial discharge resistance evaluation unit 22 counts, every time it receives an output from the second detector level partial discharge counting unit 21b, the number of input signals from the second detector level partial discharge counting unit 21b at an applied voltage. The partial discharge resistance evaluation unit 22 determines whether or not a count value of the number of input signals from the first detector level partial discharge counting unit 21a and the number of inputs from the second detector level partial discharge counting unit 21b has reached a predetermined value in response to a specified number of impulse voltage applications. Specifically, for example, when the impulse voltage is applied 10 times, the partial discharge resistance evaluation unit 22 determines whether or not the count value has reached five. When determining that the count value has reached the predetermined value, the partial discharge resistance evaluation unit 22 regards an impulse voltage value applied at this time as the partial discharge inception voltage under the repeated impulse voltage application.

Figure 3:
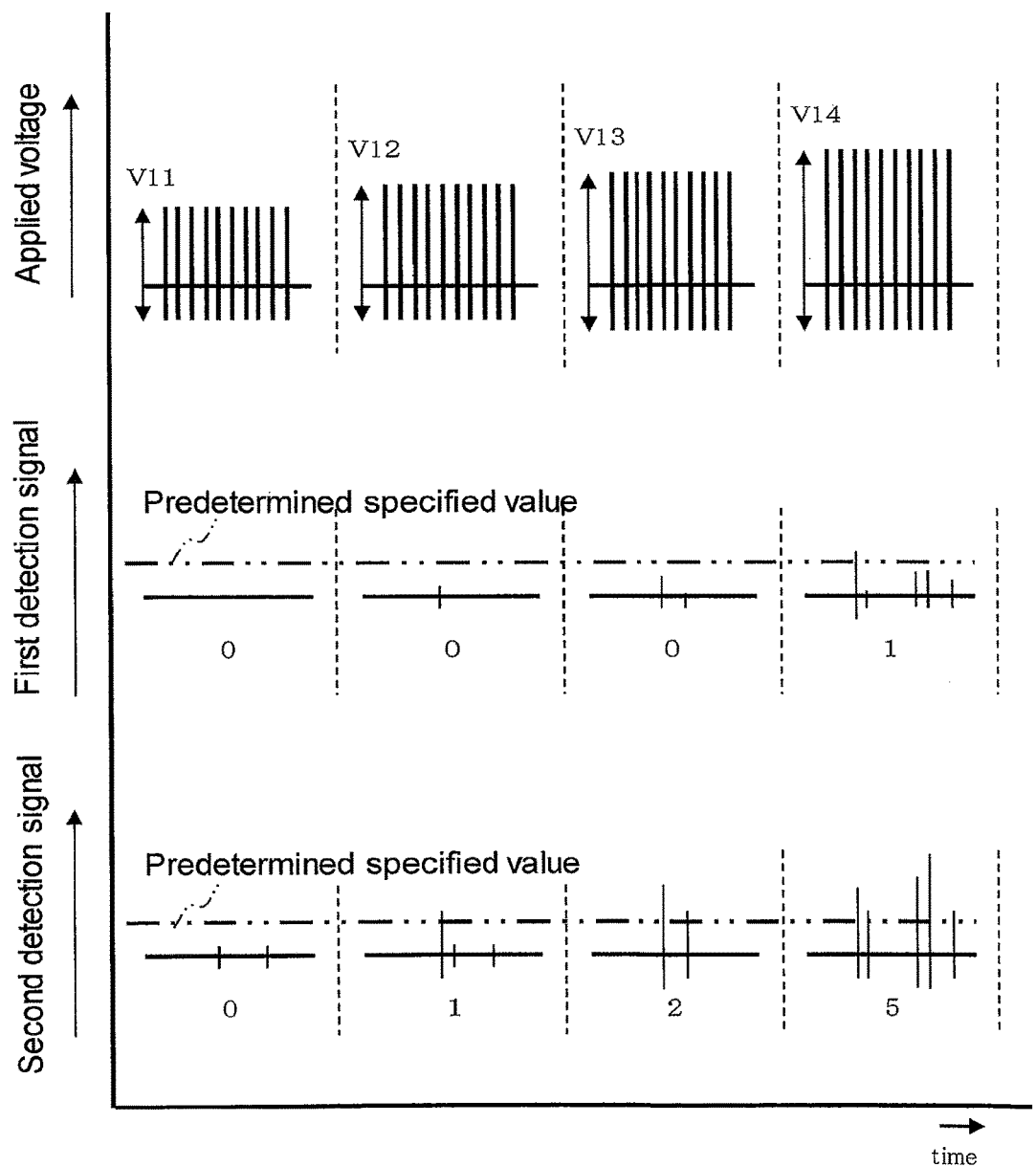
FIG. 3 is a diagram for explaining the number of impulses for generating partial discharge when a voltage level is increased in the partial discharge measurement device according to the first embodiment.

FIG. 3 is a diagram for explaining the number of impulses for generating partial discharge when a voltage level is increased in the partial discharge measurement device according to the first embodiment. The measurement control unit 20 determines presence/absence of occurrence of the partial discharge based on a comparison with a predetermined specified value and counts the number of occurrences of the partial discharge. When the number of occurrences of the partial discharge has not reached a predetermined value at a predetermined applied voltage, the measurement control unit 20 outputs an instruction signal to the impulse voltage application unit 13 to instruct sequential output of impulses of higher voltage. Then, when the number of occurrences of the partial discharge has reached a predetermined value, the measurement control unit 20 regards the applied voltage at this time as the partial discharge inception voltage under the repeated impulse voltage application.

In the example of FIG. 3, the applied voltage is sequentially increased as V11, V12, V13, and V14, and voltage application is performed 10 times at each voltage. When the applied voltage is V11, a signal exceeding the specified voltage is input to neither the first detector level partial discharge counting unit 21a nor the second detector level partial discharge counting unit 21b.

When the applied voltage is V12, no signal exceeding the specified voltage is input to the first detector level partial discharge counting unit 21a, while one signal exceeding the specified value is input to the second detector level partial discharge counting unit 21b. When the applied voltage is V13, no signal exceeding the specified voltage is input to the first detector level partial discharge counting unit 21a, while two signals exceeding the specified value are input to the second detector level partial discharge counting unit 21b.

When the applied voltage is V14, one signal exceeding the specified voltage is input to the first detector level partial discharge counting unit 21a, and five signals exceeding the specified value are input to the second detector level partial discharge counting unit 21b.

As described above, five signals exceeding the specified value are counted in the second detector level partial discharge counting unit 21b when the applied voltage is V14 and, accordingly, the count value of the number of output signals from the second detector level partial discharge counting unit 21b is five also in the partial discharge resistance evaluation unit 22. Thus, the partial discharge resistance evaluation unit 22 regards the impulse voltage value V14 applied at this time as the partial discharge inception voltage under the repeated impulse voltage application.

Figure 4:
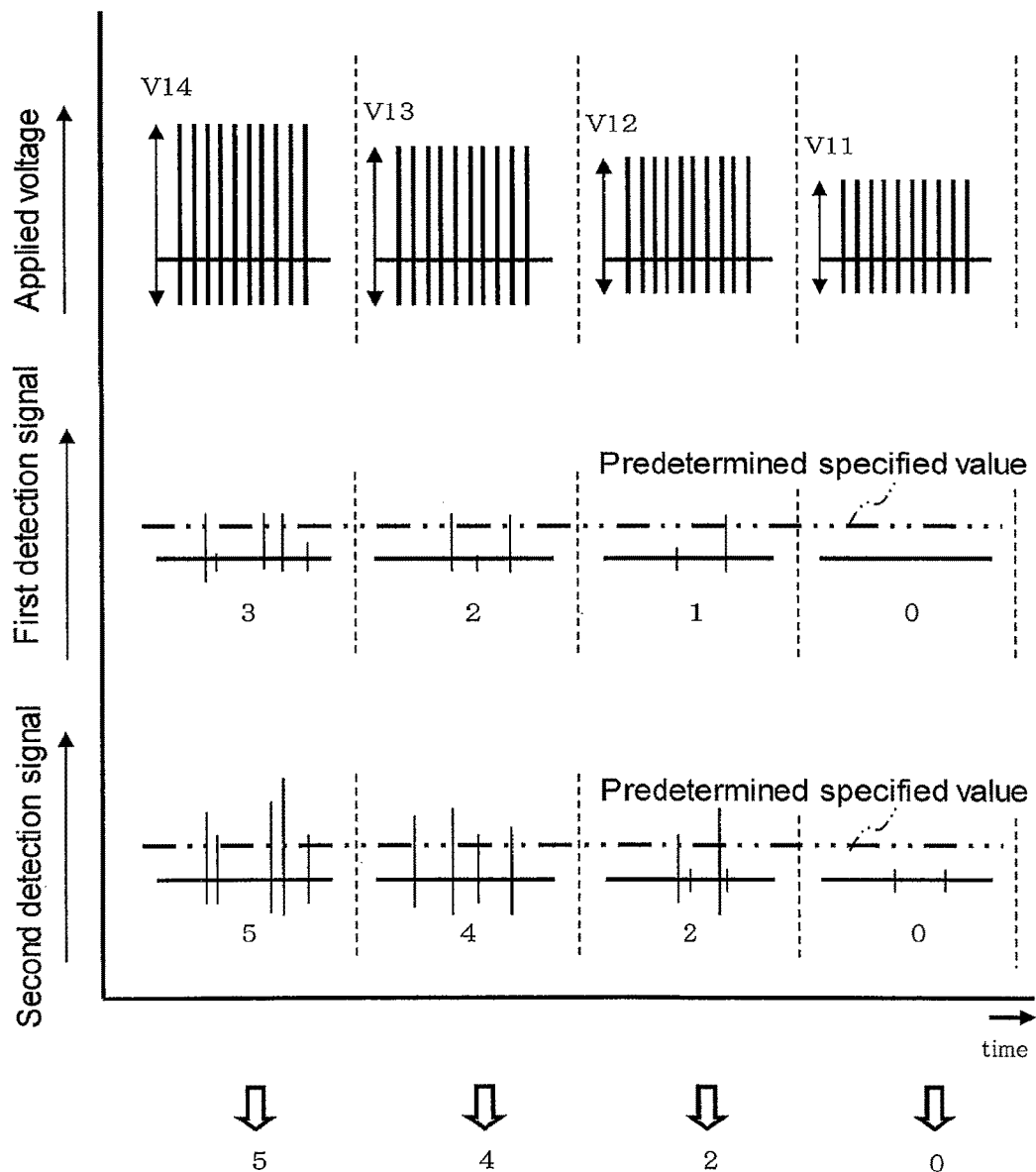
FIG. 4 is a diagram for explaining the number of impulses for generating partial discharge when a voltage level is decreased in the partial discharge measurement device according to the first embodiment.

FIG. 4 is a diagram for explaining the number of impulses for generating partial discharge when a voltage level is decreased in the partial discharge measurement device according to the first embodiment. Conversely to the case of FIG. 3, the applied voltage is decreased as V14, V13, V12, and V11, and voltage application is performed 10 times at each voltage. When the number of occurrences of the partial discharge has fallen below a predetermined value, the measurement control unit 20 regards the applied impulse voltage value as the partial discharge extinction voltage under the repeated impulse voltage application.

In the example of FIG. 4, when the applied voltage is V14, three signals exceeding the specified voltage are input to the first detector level partial discharge counting unit 21a, and five signals exceeding the specified value are input to the second detector level partial discharge counting unit 21b. That is, the larger one of the number of input signals to the partial discharge resistance evaluation unit 22 from the first detector level partial discharge counting unit 21a and the number of input signals from the second detector level partial discharge counting unit 21b is five, and V14 has been already regarded as the partial discharge inception voltage.

When the applied voltage is V13, two signals exceeding the specified voltage are input to the first detector level partial discharge counting unit 21a, and four signals exceeding the specified value are input to the second detector level partial discharge counting unit 21b. That is, the larger one of the number of input signals to the partial discharge resistance evaluation unit 22 from the first detector level partial discharge counting unit 21a and the number of input signals from the second detector level partial discharge counting unit 21b is four. When the applied voltage is V12, one signal exceeding the specified voltage is input to the first detector level partial discharge counting unit 21a, and two signals exceeding the specified value are input to the second detector level partial discharge counting unit 21b. That is, the larger one of the number of input signals to the partial discharge resistance evaluation unit 22 from the first detector level partial discharge counting unit 21a and the number of input signals from the second detector level partial discharge counting unit 21b is two. When the applied voltage is V11, a signal exceeding the specified voltage is input to neither the first detector level partial discharge counting unit 21a nor the second detector level partial discharge counting unit 21b. That is, when the applied voltage is V13, both the number of input signals from the first and second detector level partial discharge counting unit 21a and the number of input signals from the second detector level partial discharge counting unit 21b fall below the specified value, i.e., five, so that the partial discharge resistance evaluation unit 22 determines V13 as the partial discharge extinction voltage under the repeated impulse voltage application.

As described above, according to the present embodiment, the partial discharge inception voltage and partial discharge extinction voltage can be accurately obtained in a measurement method based on the repeated impulse voltage which is performed for evaluating insulation performance of an object to be measured such as an electric motor winding.

Second Embodiment

A second embodiment of the present invention is a modification of the first embodiment described above. The second embodiment differs from the first embodiment in processing details of the respective first and second detector level partial discharge counting units 21a and 21b and in processing details of the partial discharge resistance evaluation unit 22.

The first detector level partial discharge counting unit 21a determines whether or not a level of the detection signal from the first partial discharge detection unit 10a exceeds a predetermined specified value, and outputs, to the partial discharge resistance evaluation unit 22, the detected signal that exceeds the predetermined specified value in response to a predetermined number of impulse voltage applications as partial discharge occurrence of the partial discharge detector level together with the occurrence time.

The second detector level partial discharge counting unit 21b determines whether or not a level of the detection signal from the second partial discharge detection unit 10b exceeds a predetermined specified value and outputs, to the partial discharge resistance evaluation unit 22, the detected signal that exceeds the predetermined specified value in response to a predetermined number of impulse voltage applications as partial discharge occurrence of the partial discharge detector level together with the occurrence time.

Upon reception of at least one of the output from the first detector level partial discharge counting unit 21a and output from the second detector level partial discharge counting unit 21b, the partial discharge resistance evaluation unit 22 counts the number of occurrences of partial discharge. The partial discharge resistance evaluation unit 22 determines whether or not the count value has reached a predetermined value in response to a specified number of impulse voltage applications. Specifically, for example, when the impulse voltage is applied 10 times, the partial discharge resistance evaluation unit 22 determines whether or not the count value has reached five. When determining that the count value has reached the predetermined value, the partial discharge resistance evaluation unit 22 regards an impulse voltage value applied at this time as the partial discharge inception voltage.

Figure 5:
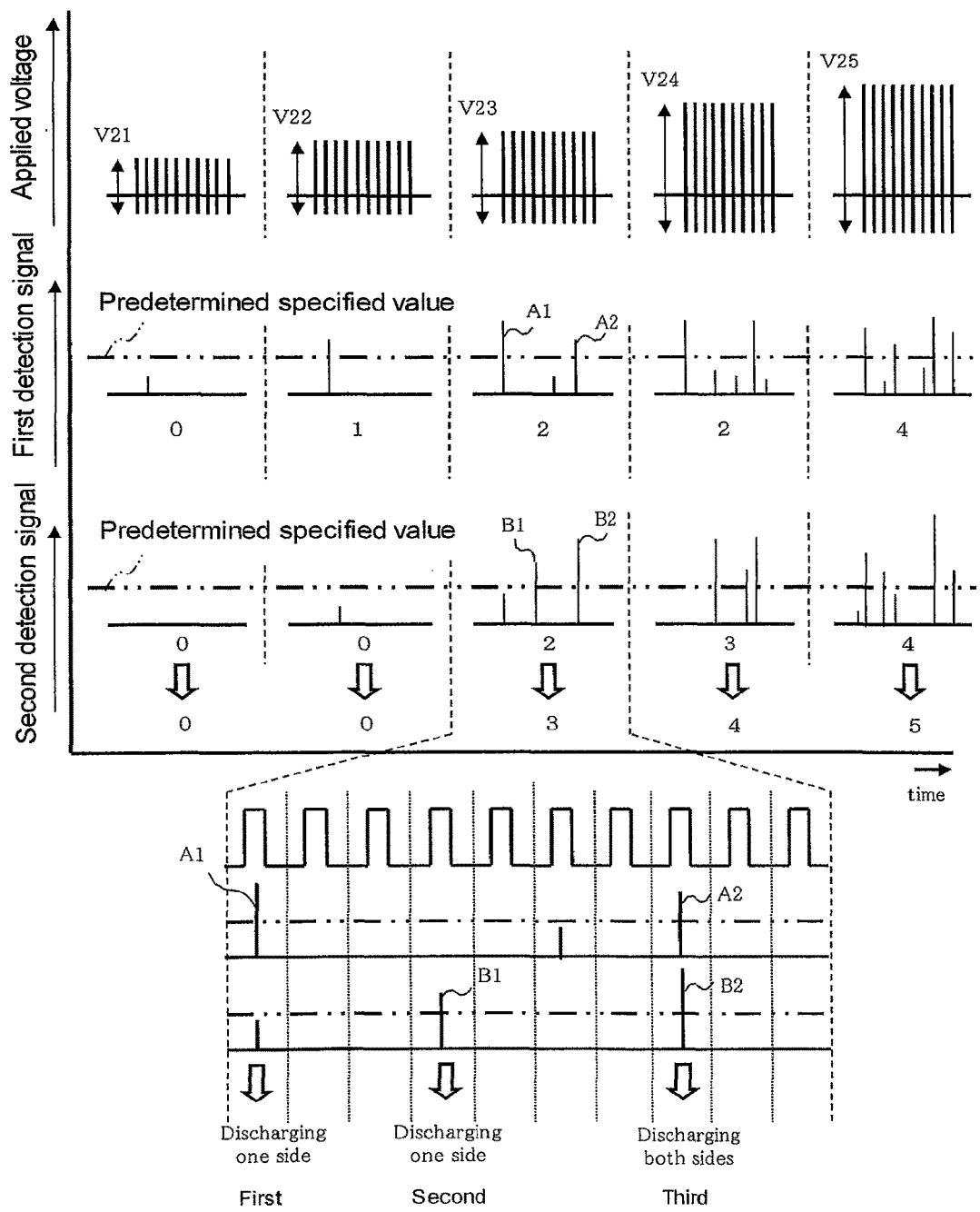
FIG. 5 is a diagram for explaining the number of impulses for generating partial discharge in the partial discharge measurement device according to the second embodiment.

FIG. 5 is a diagram for explaining the number of impulses for generating partial discharge in the partial discharge measurement device according to the second embodiment. FIG. 5 illustrates the number of impulses for generating partial discharge when a voltage is increased in the partial discharge measurement device according to the second embodiment.

When the applied voltage is V21, a signal exceeding the specified value is input to neither the first detector level partial discharge counting unit 21a nor the second detector level partial discharge counting unit 21b. When the applied voltage is V22, one signal exceeding the specified value is input to the first detector level partial discharge counting unit 21a, while no signal exceeding the specified value is input to the second detector level partial discharge counting unit 21b. When the applied voltage is V23, two signals exceeding the specified value are input to both the first and second detector level partial discharge counting units 21a and 21b. When the applied voltage is V24, two signals exceeding the specified value are input to the first detector level partial discharge counting unit 21a, and three signals exceeding the specified value are input to the second detector level partial discharge counting unit 21b. When the applied voltage is V25, four signals exceeding the specified value are input to both the first and second detector level partial discharge counting units 21a and 21b.

A description will be made taking the case where the applied voltage is V23 as an example. When the applied voltage is V23, two signals exceeding the specified value are input to both the first and second detector level partial discharge counting units 21a and 21b, where one (A2) of the two signals for the first detector level partial discharge counting unit 21a and one (B2) of the two signals for the second detector level partial discharge counting unit 21b are input simultaneously. Therefore, the number of signal inputs from any of the first and second detector level partial discharge counting units 21a and 21b is three. Thus, when the applied voltage is V23, a count value of the partial discharge resistance evaluation unit 22 is three.

Similarly, when the applied voltage is V24, two signals exceeding the specified value are input to the first detector level partial discharge counting unit 21a, and three signals exceeding the specified value are input to the second detector level partial discharge counting unit 21b, where one of the two signals for the first detector level partial discharge counting unit 21a and one of the three signals for the second detector level partial discharge counting unit 21b occur simultaneously. Therefore, a count value of the partial discharge resistance evaluation unit 22 is four (2+3−1=4). When the applied voltage is V25, four signals exceeding the specified value are input to both the first and second detector level partial discharge counting units 21a and 21b, where three of the four signals for the first detector level partial discharge counting unit 21a and three of the four signals for the second detector level partial discharge counting unit 21b occur simultaneously. Therefore, a count value of the partial discharge resistance evaluation unit 22 is five (4+4−3=5).

As a result, the partial discharge resistance evaluation unit 22 determines the applied voltage V25 (count value is five) as the partial discharge inception voltage under the repeated impulse voltage application. The partial discharge extinction voltage can be determined in the same manner.

As described above, in the present embodiment, by using outputs from the two detectors in a comprehensive way, the partial discharge inception voltage and the partial discharge extinction voltage can be accurately obtained in a measurement method based on the repeated impulse voltage which is performed for evaluating insulation performance of an object to be measured such as an electric motor winding.

Third Embodiment

Figure 6:
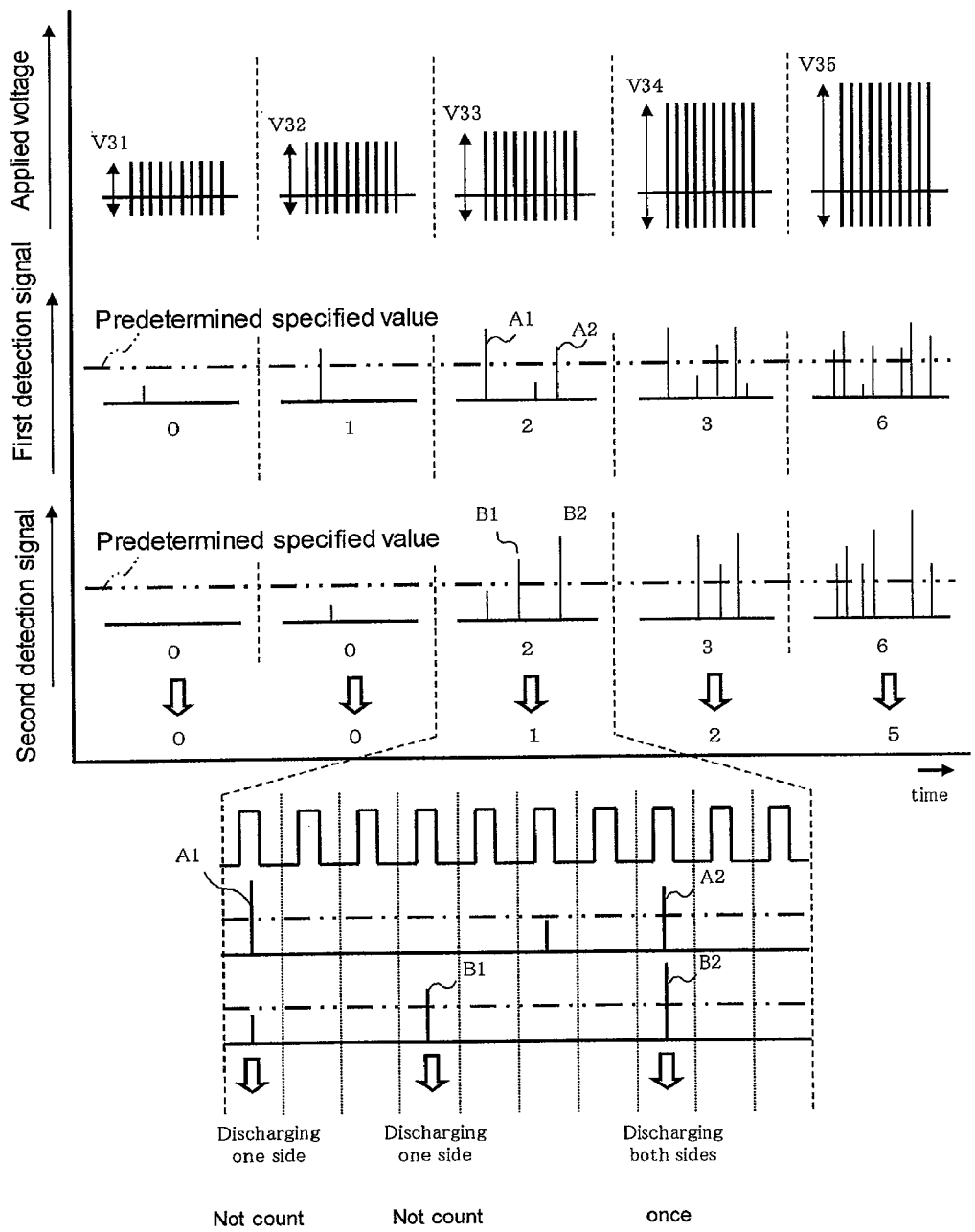
FIG. 6 is a diagram for explaining the number of impulses for generating partial discharge in the partial discharge measurement device according to a third embodiment.

FIG. 6 is a diagram for explaining the number of impulses for generating partial discharge in the partial discharge measurement device according to a third embodiment. The present invention is a modification of the second embodiment. The count method in the first and second detector level partial discharge counting units 21a and 21b and output method thereof to the partial discharge resistance evaluation unit 22 are the same as those in the first embodiment.

The partial discharge resistance evaluation unit 22 counts when the signal is output from any of the first and second detector level partial discharge counting units 21a and 21b in the second embodiment; on the other hand, in the present third embodiment, the partial discharge resistance evaluation unit 22 counts only when the signals are output from both the first and second detector level partial discharge counting units 21a and 21b simultaneously.

A concrete count method in the partial discharge resistance evaluation unit 22 will be described taking a case where the applied voltage is V33 (FIG. 6) as an example. As a signal exceeding the specified value, signals A1 and A2 are input to the first detector level partial discharge counting unit 21a, and the first detector level partial discharge counting unit 21a output to the partial discharge resistance evaluation unit 22 at these two timings. Similarly, signals B1 and B2 are input as the signal exceeding the specified value to the second detector level partial discharge counting unit 21b, and the second detector level partial discharge counting unit 21b output to the partial discharge resistance evaluation unit 22 at these two timings. Among them, the signal A2 and signal B2 occur simultaneously.

The partial discharge resistance evaluation unit 22 counts only when the signals are input thereto from both the first and second detector level partial discharge counting units 21a and 21b simultaneously. Thus, when the signal A1 is input from the first detector level partial discharge counting unit 21a, the partial discharge resistance evaluation unit 22 does not count since no signal is input from the second detector level partial discharge counting unit 21b. Further, when the signal B1 is input from the second detector level partial discharge counting unit 21b, the partial discharge resistance evaluation unit 22 does not count since no signal is input from the first detector level partial discharge counting unit 21a.

When the signal A2 is input from the first detector level partial discharge counting unit 21a, the partial discharge resistance evaluation unit 22 counts since the signal B2 is input from the second detector level partial discharge counting unit 21b simultaneously. At the applied voltage V33, the number of times that the signals from both the first and second detector level partial discharge counting units 21a and 21b are input simultaneously is only once. Thus, a count value of the partial discharge resistance evaluation unit 22 is one, and thus the partial discharge resistance evaluation unit 22 does not determine the applied voltage V33 as the partial discharge inception voltage under the repeated impulse voltage application.

Similarly, the partial discharge resistance evaluation unit 22 counts the number of input signals at the applied voltage V34 as two signals and at the applied voltage V35 as five signals. As a result, the partial discharge resistance evaluation unit 22 determines the applied voltage V35, at which count value is five, as the partial discharge inception voltage under the repeated impulse voltage application.

When obtaining the partial discharge extinction voltage while reducing the applied voltage, the partial discharge resistance evaluation unit 22 uses the same count method as the above-described method used in obtaining the partial discharge inception voltage while increasing the applied voltage.

As described above, the partial discharge resistance evaluation unit 22 counts only when receiving the signals from both the first detector level partial discharge counting unit 21a and the second detector level partial discharge counting unit 21b simultaneously. Thus, when an erroneous signal occurs in the first detector level partial discharge counting unit 21a or the second detector level partial discharge counting unit 21b, or on an upstream sides of the respective first detector level partial discharge counting unit 21a or the second detector level partial discharge counting unit 21b, the signal is input only from one of the first detector level partial discharge counting unit 21a and the second detector level partial discharge counting unit 21b. So, the partial discharge resistance evaluation unit 22 does not count. Thus, reliability of measurement can be ensured without adverse effect due to occurrence of the erroneous signal, for example, without estimating the partial discharge inception voltage lower than the value which should be decided.

As described above, according to the present embodiment, the partial discharge inception voltage and partial discharge extinction voltage can be accurately obtained in a measurement method based on the repeated impulse voltage which is performed for evaluating insulation performance of an object to be measured such as electric motor windings.

Fourth Embodiment

Figure 7:
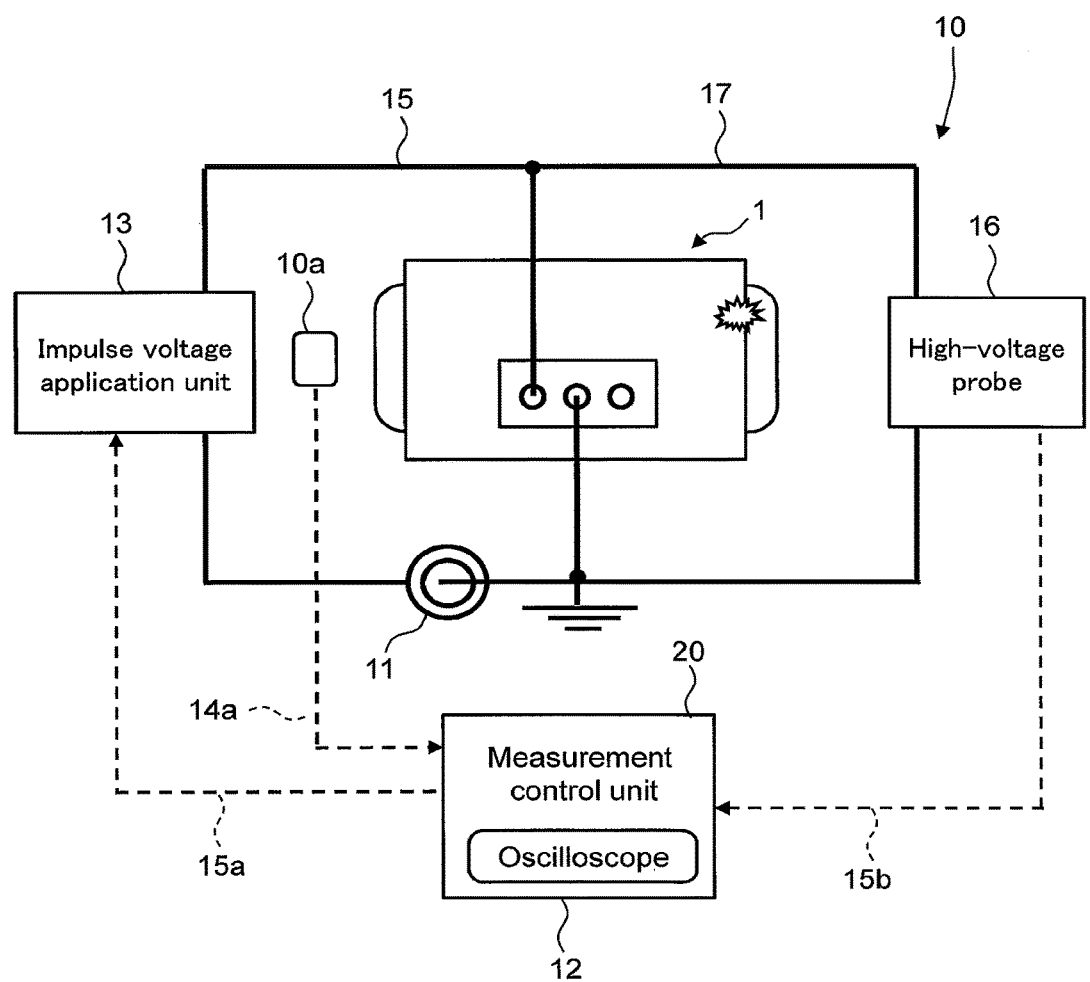
FIG. 7 is a conceptual block diagram illustrating a configuration of a partial discharge measurement device according to a fourth embodiment.

FIG. 7 is a conceptual block diagram illustrating a configuration of a partial discharge measurement device according to a fourth embodiment. The present embodiment is a modification of the first to third embodiments. In the first to third embodiments, the first partial discharge detection unit 10a and the second partial discharge detection unit 10b use the same detection method. On the other hand, in the fourth embodiment, there are provided the first partial discharge detection unit 10a and an another-manner partial discharge detection unit 11 that uses a different detection method from that used by the first partial discharge detection unit 10a.

The another-manner partial discharge detection unit 11 is of a type that detects a current generated in a circuit of the electric motor 1 by the partial discharge, such as a high-frequency CT. Further, the first partial discharge detection unit 10a is of a type that measures an electromagnetic wave, such as a loop antenna or a patch antenna.

Thus, by using the two detection units of different types, it is possible to avoid a problem that a detection function is deteriorated due to the situation peculiar to the detection method, thereby ensuring reliability of measurement.

Other Embodiments

Although the preferred embodiments of the present invention have been described above, the embodiments are merely illustrative and do not limit the scope of the present invention. For example, although the present invention is applied to the electric motor in the above embodiments, it may be applied to electric devices other than the electric motor. Further, features of the respective embodiments may be combined.

Further, the combination of different detection methods which is the feature of the fourth embodiment may be combined with the first to third embodiments. Further, although only the two detectors are provided in the above respective embodiments, the present invention is not limited to this. For example, in place of the two detectors provided in the first or second embodiment, two pairs of detectors may be provided. In this case, detectors in each pair are made to have different detection methods.

Further, these embodiments can be practiced in other various forms, and various omissions, substitutions and changes may be made without departing from the scope of the invention.

The embodiments and modifications thereof are included in the scope or spirit of the present invention and in the appended claims and their equivalents.

EXPLANATION OF REFERENCE SYMBOLS

1: electric motor, 10: partial discharge measurement device, 10a: first partial discharge detection unit, 10b: second partial discharge detection unit, 11: another-manner partial discharge detection unit, 12: oscilloscope, 13: impulse voltage application unit, 14a, 14b, 15, 15a, 15b: cable, 16: high-voltage probe, 17: cable, 20: measurement control unit, 21a: first detector level partial discharge counting unit, 21b: second detector level partial discharge counting unit, 22: partial discharge resistance evaluation unit

The invention claimed is:

1. A partial discharge measurement device for measuring partial discharge characteristics observed when a repeated impulse voltage is applied to an object to be measured, the device comprising:

an impulse voltage application unit configured to generate the repeated impulse voltage at time intervals and to apply the generated repeated impulse voltage to the object to be measured;

a measurement control unit configured to instruct a level and an occurrence time of a specified number of times of the repeated impulse voltage having a same peak value, to the impulse voltage application unit, and to instruct the impulse voltage application unit to change a voltage as needed after the repeated impulse voltage application at the specified number of times; and first and second partial discharge detection units disposed separately from each other so as to obtain discharge characteristics of different portions of the object to be measured, the first and second partial discharge detection units being configured to detect a partial discharge generated in the object to be measured as a result of the repeated impulse voltage application, wherein the measurement control unit includes:

a first detector level partial discharge counting unit configured to determine whether or not a first detection signal from the first partial discharge detection unit exceeds a predetermined specified value that is higher than a level of background noise, and to output the first detection signal that exceeds the predetermined specified value in response to a predetermined number of the repeated impulse voltage applications as partial discharge occurrence of the partial discharge detector level together with the occurrence time;

a second detector level partial discharge counting unit configured to determine whether or not a second detection signal from the second partial discharge detection unit exceeds a predetermined specified value that is higher than a level of background noise, and to output the second detection signal that exceeds the predetermined specified value in response to a predetermined number of the repeated impulse voltage applications as partial discharge occurrence of the partial discharge detector level together with the occurrence time; and a partial discharge resistance evaluation unit configured to determine, when a voltage level of the repeated impulse voltage is changed to an increase side, that the partial discharge has occurred when receiving an output from at least one of the first and second detector level partial discharge counting units, and to count the number of occurrences of partial discharge based on an output from the first detector level partial discharge counting unit and an output from the second detector level partial discharge counting unit, and to determine whether or not the number of occurrences has reached a predetermined value in response to the specified number of repeated impulse voltage applications, and to regard an impulse voltage value at which a count value has reached the predetermined value as a partial discharge inception voltage under the repeated impulse voltage application.

2. The partial discharge measurement device according to claim 1, wherein
the partial discharge resistance evaluation unit is configured to determine, when the voltage level of the repeated impulse voltage is changed to a decrease side, whether or not the count value has fallen below a predetermined value in response to the specified number of repeated impulse voltage applications, and to regard a repeated impulse voltage value at which the count value has fallen below the predetermined value as a partial discharge extinction voltage under the repeated impulse voltage application.

3. The partial discharge measurement device according to claim 1, wherein the first and second partial discharge detection units are configured to use different detection methods from each other.

4. The partial discharge measurement device according to claim 1, wherein the partial discharge resistance evaluation unit is configured to determine, only when receiving outputs from both the first and second detector level partial discharge counting units, that the partial discharge has occurred, and to count the number of occurrences.

5. The partial discharge measurement device according to claim 1, wherein the first and second partial discharge detection units each are of a type that measures an electromagnetic wave.

6. The partial discharge measurement device according to claim 1, wherein the first and second partial discharge detection units each are of a type that detects a current generated in a circuit of the object.

7. The partial discharge measurement device according to claim 1, wherein the first and second partial discharge detection units each are of a type that uses an acoustic sensor system.

* * * * *